United States Patent [19]

Zbinden

[11] Patent Number: 4,527,075
[45] Date of Patent: Jul. 2, 1985

[54] CLOCK SOURCE WITH AUTOMATIC DUTY CYCLE CORRECTION

[75] Inventor: Terry B. Zbinden, Maple Grove, Minn.

[73] Assignee: Sperry Corporation, New York, N.Y.

[21] Appl. No.: 512,255

[22] Filed: Jul. 11, 1983

[51] Int. Cl.³ .................. H03L 1/00; H03K 3/03; H03K 5/26

[52] U.S. Cl. .................. 307/265; 307/234; 307/269; 328/58; 328/111; 331/183

[58] Field of Search .......... 307/455, 480, 234, 269, 307/265–267; 328/58, 111, 112, 63, 72; 331/177 R, 183

[56] References Cited

U.S. PATENT DOCUMENTS

| | | | |
|---|---|---|---|
| 3,721,835 | 3/1973 | Hess | 307/265 X |
| 3,979,693 | 9/1976 | Saari | 331/183 X |
| 4,034,236 | 7/1977 | Aveneau et al. | 307/265 X |
| 4,038,611 | 7/1977 | Greig | 331/177 R X |
| 4,149,179 | 4/1979 | Wilcox | 307/265 X |
| 4,277,697 | 7/1981 | Hall et al. | 307/265 |
| 4,439,689 | 3/1984 | Chazenfus | 328/58 X |
| 4,461,962 | 7/1984 | Hacke et al. | 307/265 |
| 4,479,216 | 10/1984 | Krambeck et al. | 307/265 X |

OTHER PUBLICATIONS

Niccore, "Phase-Lock Loop With Constant Duty Cycle", IBM Tech. Disc. Bull. vol. 14, No. 6, Nov. 1971 pp. 1838–1839.

*Primary Examiner*—Stanley D. Miller
*Assistant Examiner*—D. R. Hudspeth
*Attorney, Agent, or Firm*—Charles A. Johnson; Kenneth T. Grace; Marshall M. Truex

[57] ABSTRACT

A clock source for timing and synchronizing the operation of digital data processing equipment and having automatic duty cycle correction is described. A source of signals provides clock signals at a predetermined frequency. A buffer circuit provides the true and complement clock signals to low pass filters that function to filter the true and complement clock signals to DC levels proportional to the duty cycle of the source signals. The DC voltages represent instantaneous deviation voltages from a known reference and are applied to a differential amplifier circuit for providing a feedback signal for adjusting the duty cycle of the clock output pulses that are available. One embodiment has the source of signals directly coupled to the buffer circuitry and utilizes the feedback signal to adjust the duty cycle of the signal source circuitry. A second embodiment has the source signals capacitively coupled to the self-correcting circuitry and the feedback signals adjust the duty cycle of the clock output signal.

19 Claims, 22 Drawing Figures

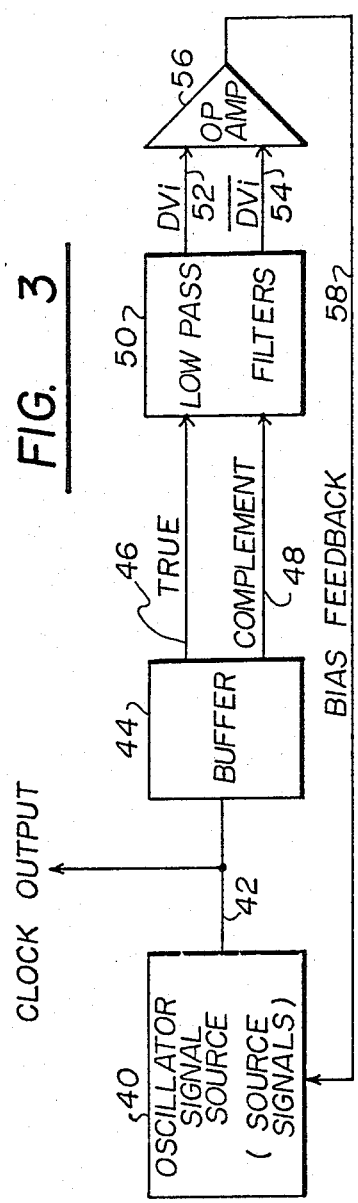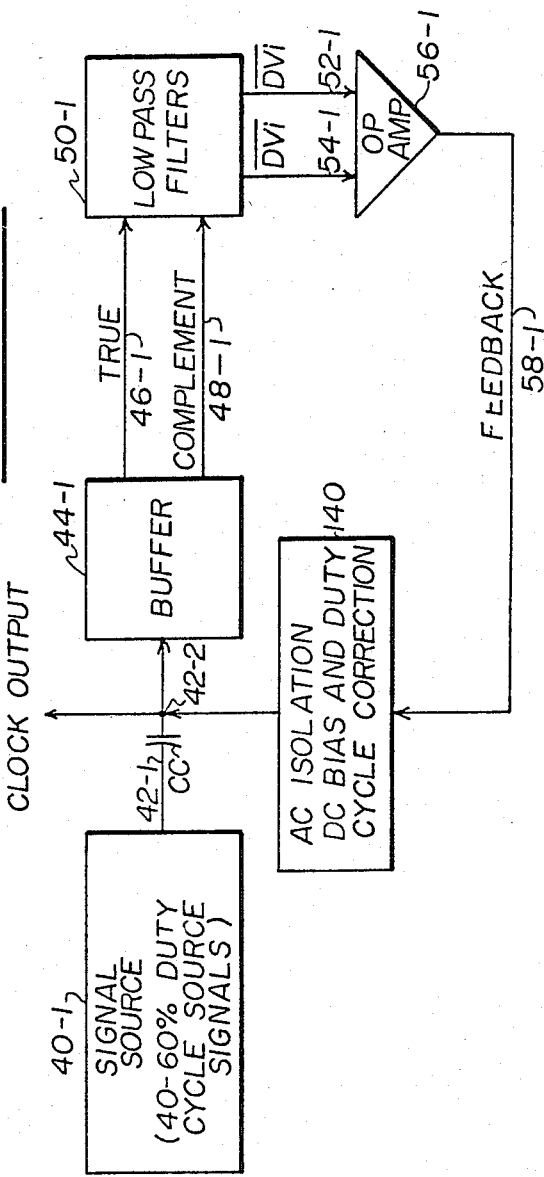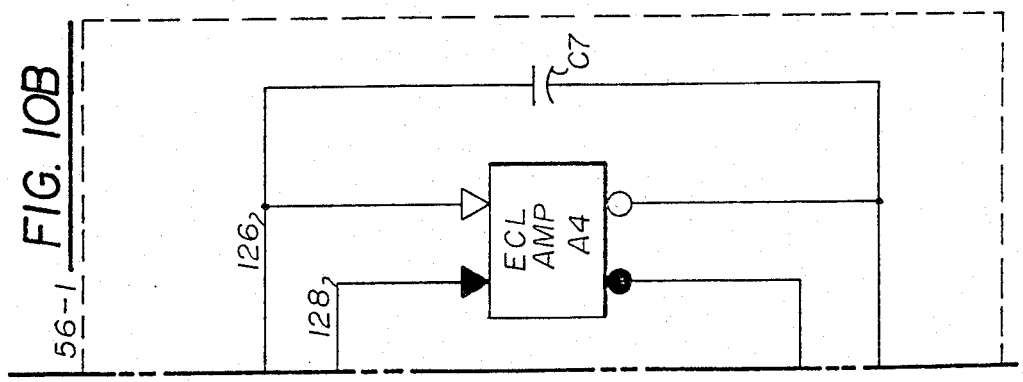

CLOCK SOURCE WITH AUTOMATIC DUTY CYCLE CORRECTION

BACKGROUND OF THE INVENTION

I. Field of the Invention

This invention relates to clock sources used for timing and synchronizing the operation of digital data processing equipment. More particularly, it relates to a clock source having automatic duty cycle correction.

2. State of the Prior Art

In synchronous digital data processing equipment it is well-known to use a clock source for developing control signals to time and synchronize circuit operations, and to time sequences. It is common to utilize an oscillator circuit to produce a basic source frequency signal, which in turn is utilized to drive shaping circuitry for developing the desired rise and fall time and desired signal levels. In addition to shaping of clock signals, it is known to utilize circuitry for developing signals that represent clock phases. For example, a basic clock frequency can be utilized to generate two-, four-, or other multi-clock phases, where the clock phase signals have predetermined interrelationship of time of occurrence. In addition to the timed relationship between the occurrence of clock phase signals, it is common for the various clock phase signals to be of similar signal shapes with regard to rise time, fall time, and amplitude. The clock phases are utilized through their known predictable time interrelationship for timing sequences of operation. If the circuitry fails to maintain the predetermined time relationship, a so-called clock skew results and the system can fail.

For timing digital data processsing systems, the clock rate requirements are proportional to the switching speeds of the circuitry employed. While early vacuum tube circuitry required clocking capability in the range of hundreds of kilohertz, discrete semiconductor circuits required clocking rates orders of magnitude faster, and the current integrated circuitry requires clocking rates order of magnitude greater than that for the discrete semiconductor circuits. As clock rates increase, tolerances are necessarily diminished, and skew becomes an ever-increasing problem.

Multi-phase clocking systems usually require a symmetrical wave shape that is characteristically desired to operate at a 50 percent duty cycle. The precision of the duty cycle operation is especially critical in systems that utilize edge or transition triggering for generation of multi-phase clock signals, and is even more critical when both leading and trailing edges are utilized to generate the phase clocking signals. At relatively low frequencies of the clock source signals, a straightforward approach to providing the desired symmetrical clock signal is to drive a flip-flop circuit with the source signal in a manner such that there is an equivalent division by two for deriving the output clock signal frequency. It is of course apparent, that the source clock frequency must be double that of the desired clock output frequency for such an approach to be feasible. As clock frequencies increase, for example at 50 megahertz and above, several design limitations arise in applying the flip-flop divider circuit. A major problem is that a flip-flop circuit will not exhibit precisely the same switching rates for driving an output terminal to achieve a rising edge as will occur to drive the output terminal in the opposite direction to achieve a falling signal edge. At high clocking rates these differences in circuit functions result in an output waveform that does not exhibit the characteristics of 50 percent duty cycle within acceptable tolerance, and accordingly provides an unsatisfactory operation. It has been found that by careful selection of components that flip-flop dividers may work adequately, but would not be self-adjusting, would be relatively expensive, and would not yield an operation of a 50 percent duty cycle within a plus or minus one percent tolerance. A further drawback, of course, is that to obtain a symmetrical clocking signals at 50 megahertz or higher would require clock source signal frequency of 100 megahertz or higher. If the driver circuit is to be fabricated the same utilizing circuit technology as the logic circuit to be gated, the flip-flop divider approach is unworkable.

It is, of course, known thaat differences in circuit fabrication result in differing operating parameters for the same circuit types. Further, in system operation circuit operations will vary according to loading, temperature variation, and the like. Prior art clocking circuits do not include self-adjusting circuitry for maintaining a 50 percent duty cycle with a plus or minus one percent tolerance over varying operating conditions.

OBJECTS

It is a primary object of the invention to provide an improved self-adjusted clock circuit for use in synchronizing and controlling digital circuitry.

Another object of the invention is a clocking circuit that will provide a symmetrical output signal with a 50 percent duty cycle within a tolerance of plus or minus one percent.

Another object of the invention is to provide a self-adjusting clocking circuit capable of providing clocking signals at a rate of 50 megahertz and higher as a symmetrical wave balanced with a margin within a tolerance of plus or minus one percent.

A further object of the invention is to provide a clocking circuit that includes a logic circuit oscillator together with self-adjusting circuitry requiring no adjustment or component selection, and capable of providing an output clocking signal with a 50 percent duty cycle at a tolerance of plus or minus one percent or less.

Still another object of the invention is to provide a clock signal adjusting circuit for adjusting a source clocking signal derived from a capacitively coupled signal source to a 50 percent duty cycle clocking signal within a tolerance of less than plus or minus one percent.

Yet a further object of the invention is to provide an improved clocking circuit that is self-adjusting for providing a 50 percent duty cycle output clocking signal from source signals exhibiting a range of 40 percent to 60 percent duty cycle.

These and other more detailed and specific objects of the invention will become apparent from a consideration of the drawings and the description of the preferred embodiment of the invention.

SUMMARY OF THE INVENTION

With the foregoing Background of the Invention and the Objects in mind, this invention is a clock source for use in a clocking system for timing and synchronizing the operation of digital data processing equipment, and includes signal source means for providing source signals utilizable as a clock output signal at a predetermined frequency. The signal source means includes output means for providing the clock output signals to buffer circuitry that is responsive to the source signals for providing the True and Complement representation thereof. These signals are applied to DC filters which are respectively low pass filters that function to filter the true and complement signals to DC levels proportional to the duty cycle of the signal source. These DC voltages are instantaneous deviation voltages from a predetermined reference and are applied to a differential amplifier for generating feedback signals. The feedback signals are utilized to continuously provide self-adjustment of the clock output signals by adjusting the DC bias whereby a clock output having a 50 percent duty cycle within a predetermined tolerance is provided.

BRIEF DESCRIPTION OF THE DRAWINGS

The invention that will satisfy the foregoing stated objectives and other more detailed objectives will be clearly understood from a consideration of the following detailed description of the preferred embodiment when taken in conjunction with the drawings in which:

FIG. 3 is a simplified blcok diagram of a clock source, including a self-adjusting oscillator directly coupled to feedback circuitry for providing a correct 50 pecent duty cycle clock output;

FIG. 9 is a simplified block diagram of a clock source including self-adjusting circuitry for providing adjustment of the clock output signal to a 50 percent duty cycle, with a signal source capacitively coupled to the self-adjusting circuitry.

DETAILED DESCRIPTION OF THE PREFERRED EMBODIMENTS

Figure 1:
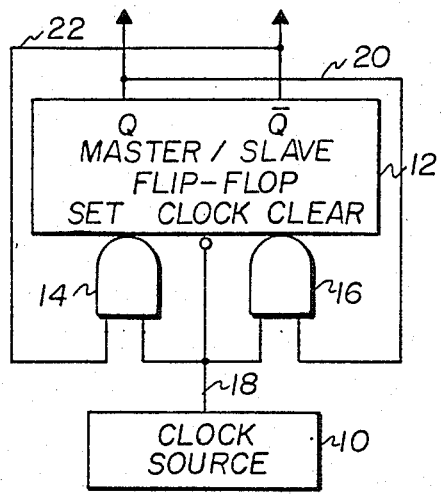
FIG. 1 is a logical block diagram of a prior art logic circuit utilizing a flip-flop for attempting to provide a balanced output signal.

FIG. 1 is a logic block diagram of a prior art logic circuit utilizing a flip-flop for attempting to provide a balanced output signal. This circuit arrangement will be considered in conjunction with FIG. 2 which illustrates a regularly occurring clock source signal and a resultant clock output signal. In FIG. 1 a Clock Source 10 provides regularly occurring Clock Source pulse. The Clock Source can include an oscillator with associated shaping circuits (not shown). A Master/Slave Flip-Flop 12 has output terminals Q and $\overline{Q}$, and is a circuit arrangement well-known. AND circuit 14 drives the SET input terminal while AND circuit 16 drives the CLEAR input terminal. The Clock Source 10 drives line 18 providing input signals to AND circuits 14 and 16, and to a complementary CLOCK input terminal. The output terminals Q and $\overline{Q}$ are cross-coupled back as input signals, with output terminal Q coupled via line 20 to AND circuit 16, and output terminal $\overline{Q}$ coupled via line 22 as an input signal to AND circuit 14. If the circuitry comprising the Master/Slave Flip-Flop 12 was completely symmetrical the output signals at terminals Q and $\overline{Q}$ would be approaching approximately 50 percent duty cycle, it being understood that the signals at these terminals are complementary of each other. It is known, however, that very minor deviations in the formation of the components and the circuit configuration results in differences in the switching on time and the switching off time of the signals.

Figure 2:
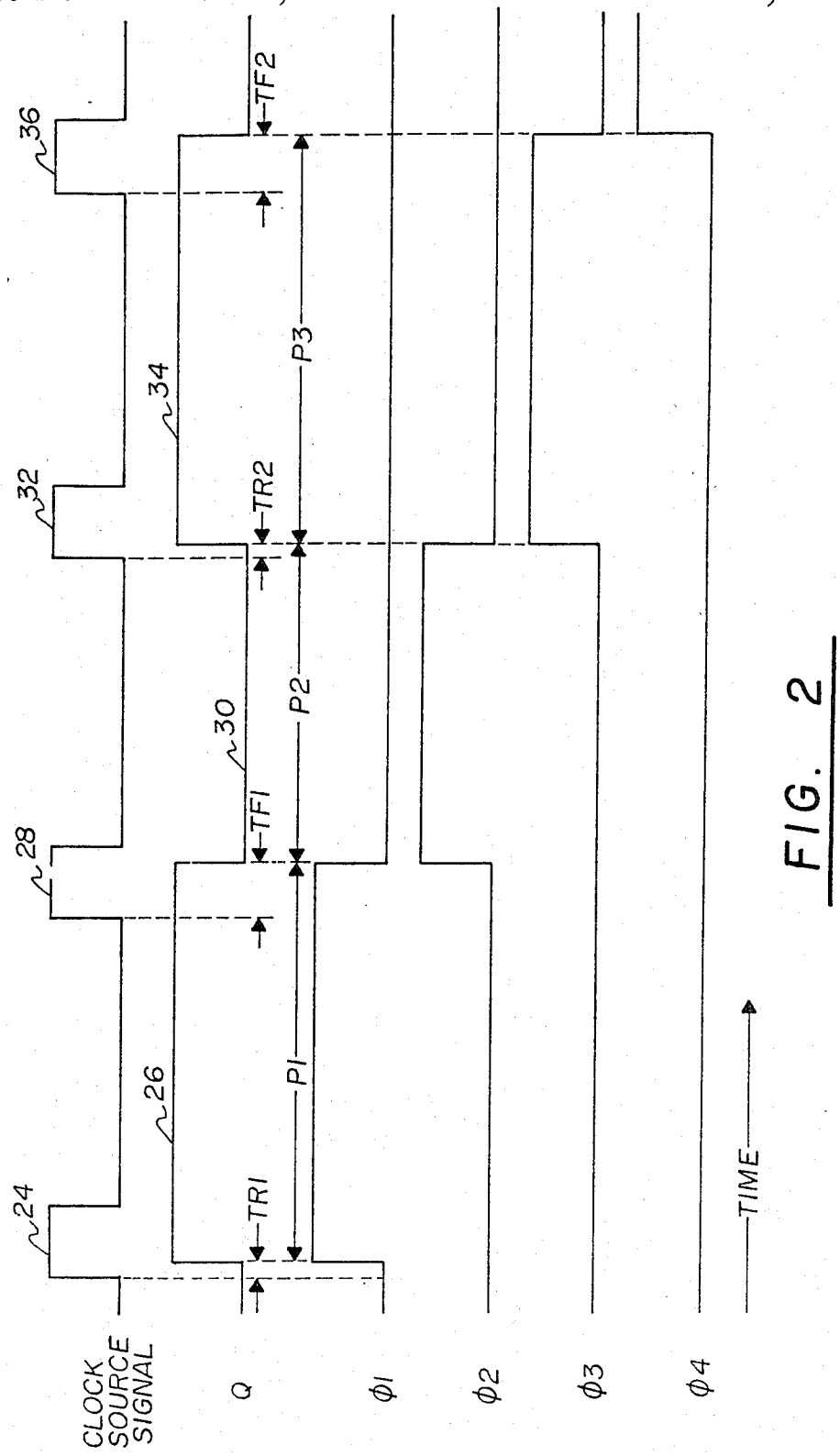
FIG. 2 illustrates an idealized waveform output from the specified input for the prior art circuit of FIG. 1, and illustrates the inability to acheive a required duty cycle relationship.

Referring to FIG. 2, the idealized output terminal Q is represented. Again, the signal is idealized for purposes of illustration. The occurrence of the first Clock Source Signal 24 causes the output signal Q to switch after a delay TR1. This output signal pulse 26 remains active until the second Clock Source Signal 28 occurs, thereby causing the Flip-Flop 12 to switch. It will be noted that the delay between the occurrence of the leading edge of Clock Source Signal 28 and the switching of the pulse 26 is characterized by a delay time TF1. It will be noted that the duration of the rising delay TR1 is less than the falling delay TF1. The overall duration of signal 26 is denoted as duration P1. The Q output signal will remain low as indicated by signal 30 until the next subsequent Clock Source Signal 32 occurrs. Again, there will be a rising delay TR2 while the Q signal is switching to the level 34. It can be seen then that the duration P2 of signal 30 is shorter than the duration P1 of signal 26. Finally, the occurrence of Clock Source Signal 36 again causes the Q output signal to switch, thereby defining a falling time TF2 yielding a duration P3 for signal 34. The same interrelationship at output signal $\overline{Q}$ but complementary to the waveform just described will also result.

It is known to utilize the clocking signals for driving other circuitry (not shown) for developing clock phase signals. For example a four-phase clock would be represented by the signals $\phi 1$ of a duration P1, $\phi 2$ of a duration P2, $\phi 3$ of a duration P3, and $\phi 4$. It will be noted that because of the asymmetrical nature of the clock signal Q, that there is a difference in the time of occurrence between sequential phases represented by durations P1, and P3 being larger than duration P2.

FIG. 3 is a simplified block diagram of a clock source including a self-adjusting oscillator providing a corrected 50 percent duty cycle clock output. An Oscillator Signal Source 40 provides Source Signals that may be asymmetrical in a range of 40 to 60 percent duty cycle. The Source Signals are provided on line 42 as the Clock Output and as input signals to the Buffer 44. The Buffer generates the True representation of the Source Signals on line 46 and the Complement thereof on line 48. These signals are applied to Low Pass Filters 50, which function to filter the True and Complement signals to DC levels proportional to the duty cycle of the Oscillator Signal Source 40. The DC voltages are instantaneous Deviation Voltages from a known reference and are DVi on line 52 and the $\overline{DVi}$ signals on line 54, are driven in opposite directions, the separation becoming larger when the Oscillator Signal Source 40 deviates further from a 50 percent duty cycle. These DC levels proportional to the duty cycle of Oscillator Signal Source 40 are applied to Op Amp 56 otherwise referred to as a Differential Amplifier, for providing amplification of the difference voltage. The output is applied as a Bias Feedback on line 58 to adjust the bias of the Oscillator Signal Source 40. The duty cycle error is continuously being corrected, and is correctable to approximately maximum error of duty cycle of one percent, thus the output at the Clock Output will be self-adjusting.

As will be described in more detail below, the preferred embodiment utilizes a logic circuit oscillator to produce the Clock Output at a frequency determined by a quartz crystal. Normally, logic circuit oscillators function with duty cycles between 40 and 60 percent without correction. Circuit selection and component selection can bring the functioning closer to 50 percent duty cycle, but with the attendant cost and without the ability to respond to changing ambient conditions to maintain the desired duty cycle operation.

Figure 4A:
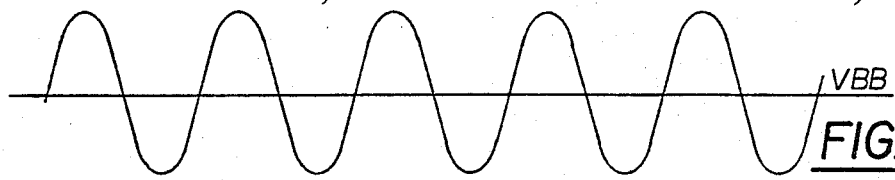
FIG. 4a through 4k illustrate sample source signals and resultant clock output signals with required self-adjustment.
Figure 4B:
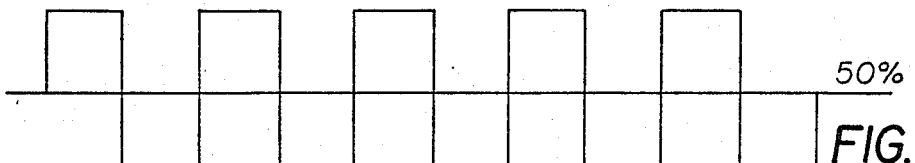
Figure 4C:
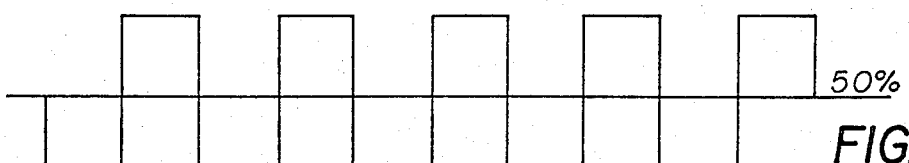

Before considering the more detailed description of the preferred embodiment, it is believed advantageous to consider the self-adjusting features of the circuit. FIG. 4a illustrates a characteristic idealized waveform provided by an oscillator prior to shaping. The reference VBB is characteristically a reference voltage and in the preferred embodiment, the entire range of voltages discussed is negative with respect to ground. When the waveform of FIG. 4a is shaped and provided as a sequence of Source Signals on line 42, the waveform would be in the configuration of FIG. 4b. The waveform is idealized, and illustrates that the Oscillator Signal Source 40 is functioning at a 50 percent duty cycle. FIG. 4c illustrates the inverse of the waveform of FIG. 4b, and it is apparent that when these waveforms are subjected to the Low Pass Filters 50, there will be no Deviation Voltage DVi or $\overline{DVi}$, hence there will be no differential voltage provided by OP AMP 56, and there will be no corrective feedback provided on line 58.

Figure 4D:
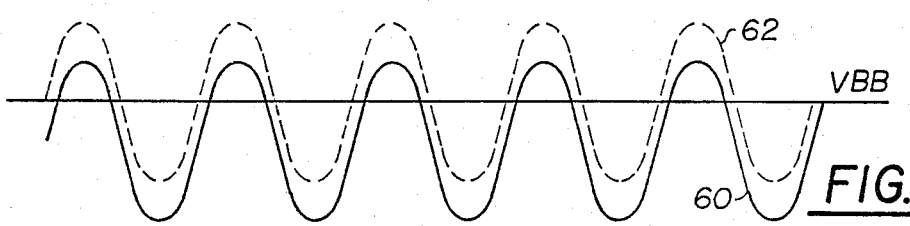

Next consider the illustrative oscillator wave shape shown in FIG. 4d. This illustrative wave shape 60 is for some reason of circuit operation not centered around the threshold voltage VBB. After shaping and submission to the Buffer circuit 44, the waveform of FIG. 4d results in the true waveform of FIG. 4e. It can be seen from this waveform that there is shown a more negative DVi. The complement waveform is shown in FIG. 4f, with $\overline{DVi}$ less negative than the 50 percent duty cycle reference. These Deviation Voltages instantaneously derived are applied to the Op Amp 56 and result in a positive voltage level being provided as a Bias Feedback on line 58 for driving the oscillator generated signal more positively, as indicated by dashed waveform 62.

Figure 4E:
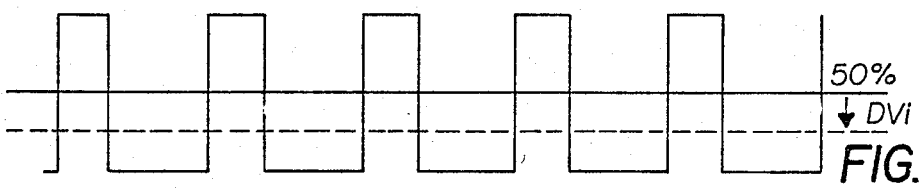
Figure 4F:
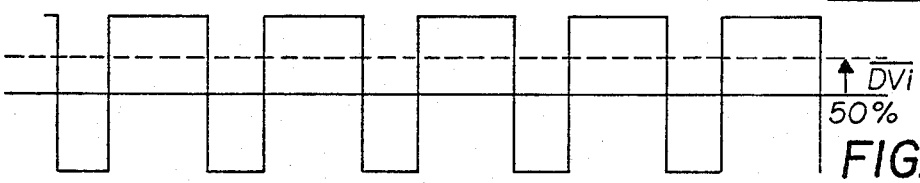
Figure 4G:
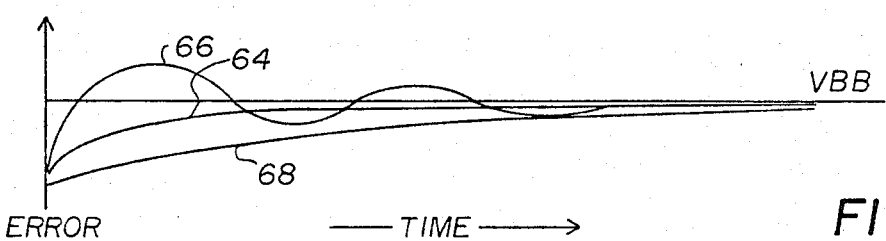

The signals of FIG. 4e and FIG. 4f are shown extending over several cycles. As will be described in more detail below, the feedback is critically biased in a manner such that elapsed time causes the adjustment of the bias of the oscillator to provide the correction of wave shape positioning shown in FIG. 4d, over a number of cycles. With reference to FIG. 4g, there is an initial error condition shown at the left, with adjustment of the duty cycle to 50 percent to approach the reference value VBB. A curve 64 illustrates the continuous adjustment of the feedback bias voltage to direct the adjustment of the level of the oscillator output in a manner such that the duty cycle of the Clock Output approaches 50 percent. These corrections occur continuously in time. If the circuit were under damped, the error correction could overshoot and would be required to be brought back. The wave shape 66 illustrates an under damped feedback loop, and is undesirable, since oscillation can occur. An over damped feedback circuit would result in a correction curve illustratively shown as curve 68. The problem of operation with an over damped feedback circuit is that it takes a longer time period to cause adjustment to the desired level.

Figure 4H:
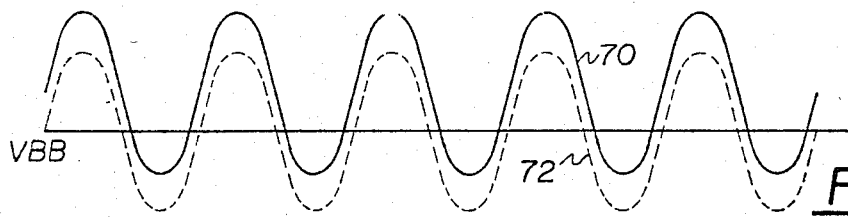
Figure 4I:
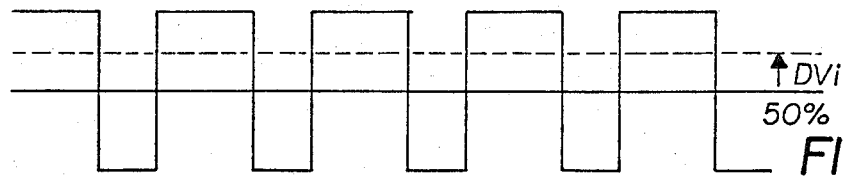
Figure 4J:
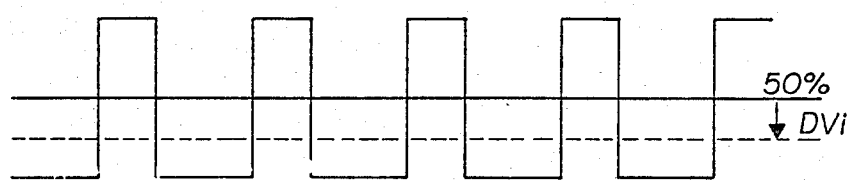
Figure 4K:
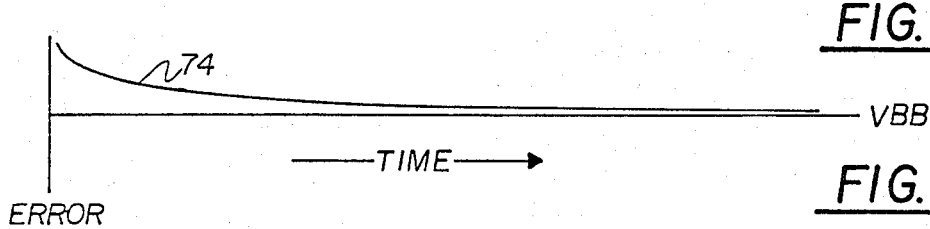

FIG. 4h illustrates error in the opposite direction from that just described with the oscillator providing signal 70 centered above the reference voltage VBB. An oscillator signal of this type results in a true signal reference shown in FIG. 4i and a complement signal as shown in FIG. 4j. This configuration results in a voltage deviation from the 50 percent duty cycle DVi being less negative or going positive, as illustrated in FIG. 4i, and the complement $\overline{DVi}$ going more negative as shown in FIG. 4j. As previously described, these Deviation Voltages are applied to the Op Amp 56 for producing a Bias Feedback that reduces the DC Bias on the Oscillator and pulls the waveform down, as illustrated by dashed waveform 72 thereby adjusting the duty cycle. The foregoing correction operation is illustrated over time in FIG. 4k, with curve 74 indicating that the error deviation from 50 percent duty cycle approaches VBB.

While the invention will operate with different frequency signals, it will find particular utility at frequencies of 50 megahertz and higher. For the detailed circuit that will be described, a characteristic peak-to-peak range is, in the order 750 millivolts.

Figure 6:
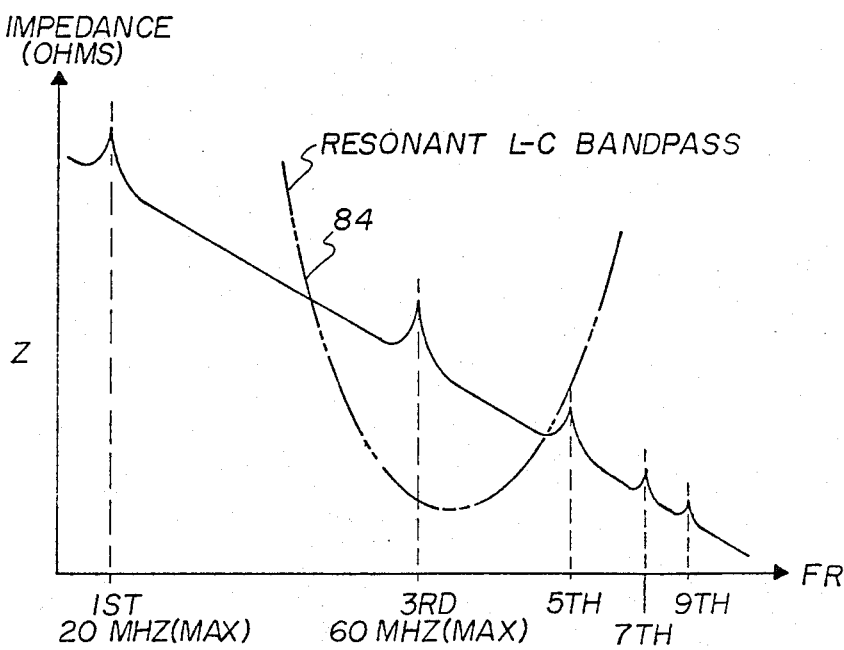
FIG. 6 is a plot of impedance Z versus frequency, with an illustrated resonant L-C bandpass curve functioning to select the fifth harmonic while blocking the fundamental and intermediate harmonics.
Figure 5:
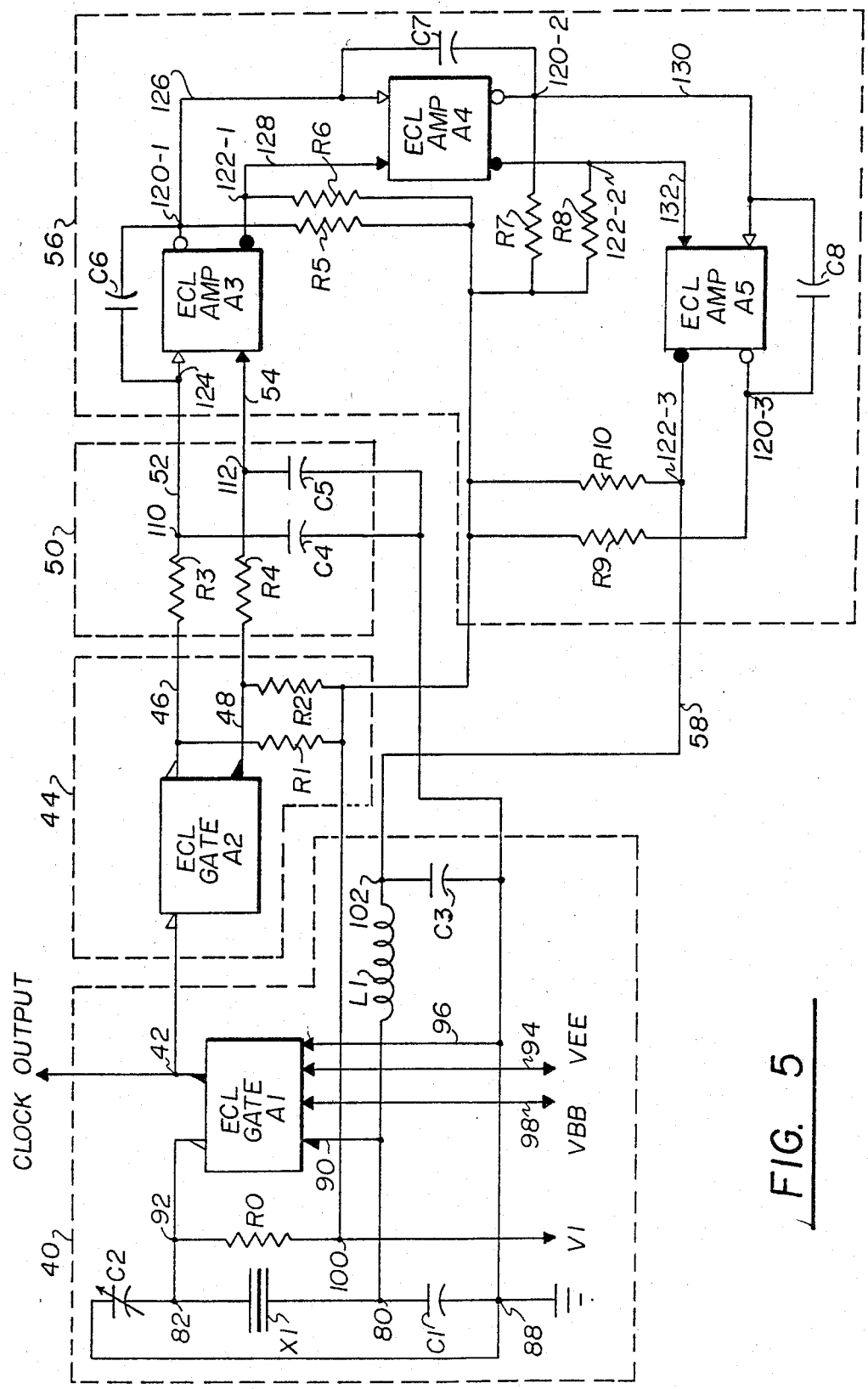
FIG. 5 is a circt diagram of the clock source with automatic self-adjusting duty cycle correction shown in FIG. 3.
Figure 10A:
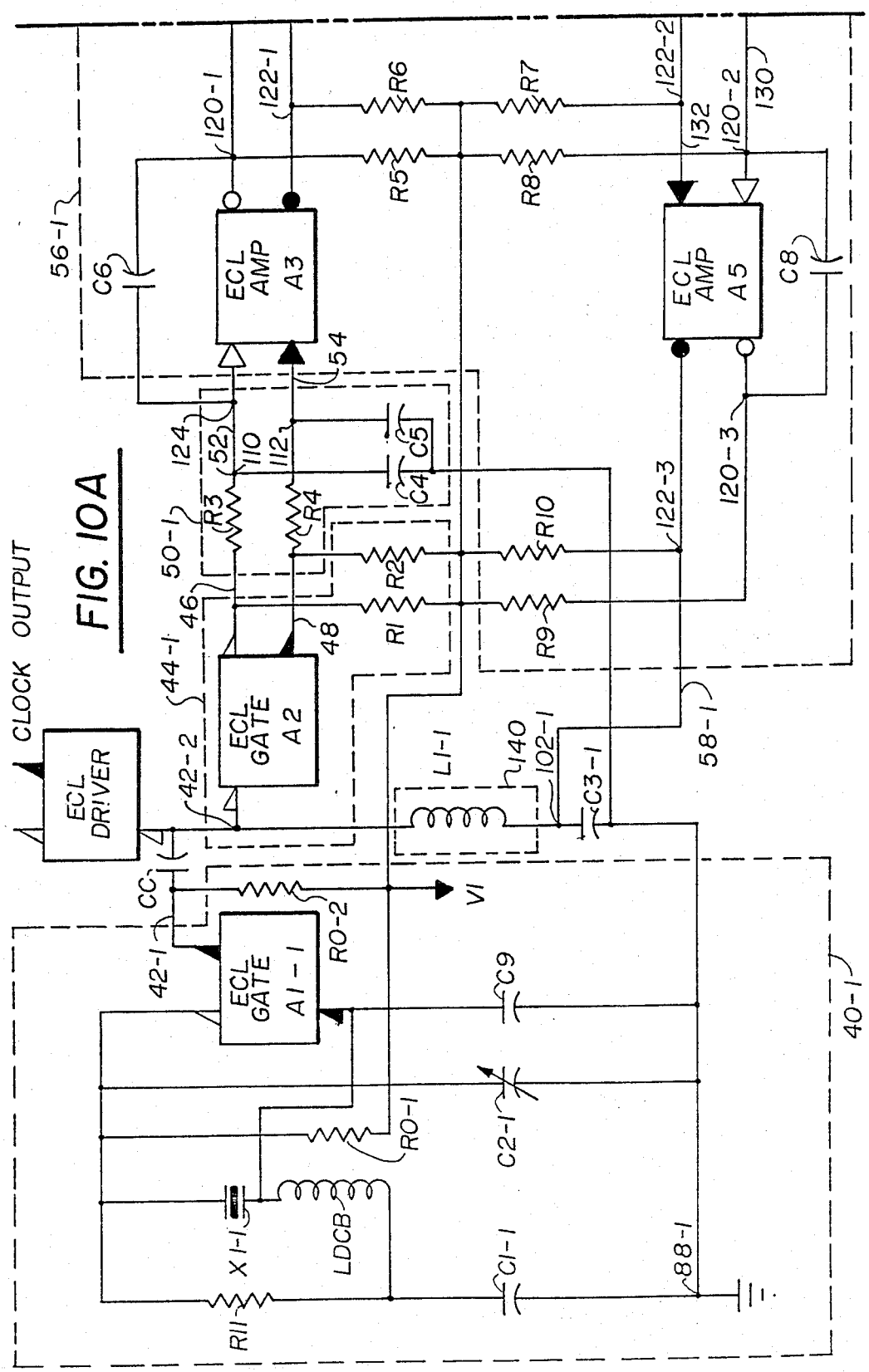

FIG. 5 is a circuit diagram of the clock source with automatic duty cycle correction. Elements that have been previously discussed will bear the same reference numerals to the extent possible for clarity. The Oscillator Signal Source is shown enclosed in dashed block 40, and includes a quartz crystal X1, for this embodiment having a frequency of 66.66 megahertz, and available commercially. The high impedance terminal, junction 80, is connected to one end or crystal X1 and the low impedance terminal is junction 82, is connected to the other end of crystal X1. An LC Filter comprised of capacitor C1, characteristically of 20 picofarads and inductor L1, characteristically 0.5 microhenry comprise a parallel resonant circuit with $f_o$ between the desired harmonic and the next lower harmonic. In this regard, attention is directed to FIG. 6, which is a plot of the crystal impedance Z versus frequency, and illustrates the Resonant L-C Bandpass curve 84 functioning to select the fifth harmonic while blocking out the fundamental, the first and third harmonics. Returning to a consideration of FIG. 5, Capacitor C2, characteristically of 30 picofarads, is coupled across junction 82 and junction 88, and provides an output phase shifting function that effectively blocks the seventh harmonic. (See FIG. 6)

An ECL Gate A1 is provided with an input terminal 90 coupled between junction 80 and one end of inductor L1. It has a True output terminal coupled to output line 42 and a Complement output terminal coupled to junction 92. Power is provided from VEE on line 94, where VEE is characteristically minus 4.5 volts. Ground reference is provided on line 96 and reference VBB is provided on line 98, where VBB is characteristically minus 1.32 volts. ECL Gate A1 is a part available commercially and is identified as part number 100102. The convention for ECL Gates for this embodiment is the closed half-arrow indicative of a high condition and the open half-arrow indicative of the low condition. A logical function is normally provided, but with only a single input, the output signals follow the input signals in either the True or Complement sense.

Resistor Ro, characteristically 50 ohms, is coupled between junction 92 and junction 100, with junction 100 in turn connected to a voltage source V1. For this configuration, $V_1$ is characteristically minus 2 volts. Resistor Ro functions to terminate the emitter follower in the output circuit of ECL Gate A1 at the Complement output terminal thereof, it being understood that junction 92 is coupled to junction 82.

Inductor L1 has one terminal coupled to junction 80 and its other terminal coupled to junction 102, the latter junction being the point of feedback connections as will be described below. Capacitor $C_3$, which is characteristically 0.1 microfarad, is coupled between junction 102 and ground. The inductor L1 in conjunction with the other circuit interconnections in the Oscillator Signal Source establishes the DC bias for the oscillator operation and establishes the basic duty cycle. As will be described more fully below, when it is sensed that the duty cycle has deviated from a 50% duty cycle, feedback signals will be provided at junction 102 to provide a shift in the DC bias of the Oscillator, thereby adjusting the duty cycle.

The Buffer is shown enclosed in dashed block 44, and essentially comprises ECL Gate A2, which is utilized to provide inverted (Complement) and non-inverted (True) output signals in lines of 48 and 46 respectively. The Emitter Coupled Logic circuit of ECL Gate A2 is available commerically, and is identified as standard part number 100102. These types of circuit components are available from Fairchild Semiconductor at Mountain View, Calif., or from Motorola Inc. at Phoenix, Ariz. It is understood that ECL Gate A2 has power connections similar to that described for ECL Gate A1, but that these power connections are not shown. Resistors R1 and R2, each of which are characteristically 50 ohms, couple lines 46 and 48 to V1, respectively, and are necessary for terminating the output circuits.

The Low Pass Filters are shown enclosed in dashed block 50. The signals applied on line 46 are filtered to a DC level proportional to the duty cycle of the applied signal by R-C Filter comprised of resistor R3, which is characteristically 510 ohms, coupled in series with line 46 to junction 110, in combination with Capacitor $C_4$, which is characteristically 0.1 microfarads and coupled from junction 110 to ground. Junction 110 is coupled to line 52 and provides the instantaneous Deviation Voltage DVi that is a DC level proportional to the duty cycle of the signal applied. In a similar manner, the inverted signal is filtered by the filter comprised of series Resistor R4, which is also characteristically 510 ohms, coupled from line 48 to junction 112. Capacitor $C_5$, which is characteristically 0.1 microfarads, is coupled across junction 112 to ground. Junction 112 is coupled to line 54 and provides the filter DC level that is proportional to the duty cycle of the inverted signal, and provides the instantaneous Deviation Voltage $\overline{DVi}$ on line 54.

The circuitry comprising Op Amp 56 in FIG. 3 is the differential amplifier shown enclosed in dashed block 56 in FIG. 5. Rather than utilize conventionally available operational amplifier circuits, the preferred embodiment utilizes a sequence of line receiver circuits ECL AMP A3, ECL AMP A4, and ECL AMP A5 operated as differential amplifiers to generate an amplified difference of the applied DVi and $\overline{DVi}$ signals. The ECL AMP circuits are available commercially, and are identified as standard part number 10114 and are available from Fairchild Semiconductor and Motorola Inc. as previously identified. These Emitter Coupler Logic (ECL) integrated circuits characteristically contain three gates which have differential inputs and two ECL outputs per gate. This circuit type is normally utilized in a gating structure, but has a linear operating range of 50 to 100 millivolts in range such that, when properly biased, it can be operated as a differential amplifier. The transistors are operated non-saturating and require external termination resistors. Each of the ECL AMP circuits has a gain of approximately four from one output, inverting or noninverting to the difference input voltage. When both outputs drive the two inputs of the next ECL AMP stage, gain is approximately eight, thereby yielding an open circuit total approximate gain of 512 of the applied Deviation Voltages. The gain is based on the amplification of the differential voltages from a reference voltage. As will be described, the last stage ECL AMP A5 uses only one output to drive the feedback line 58, so the gain will be approximately 256.

Figure 8:
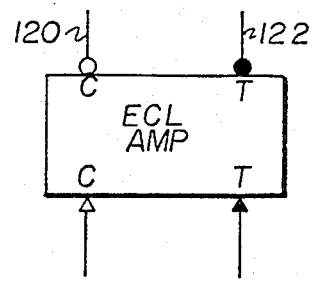
FIG. 8 is a circuit diagram representation of the ECL Amplifier.
Figure 7:
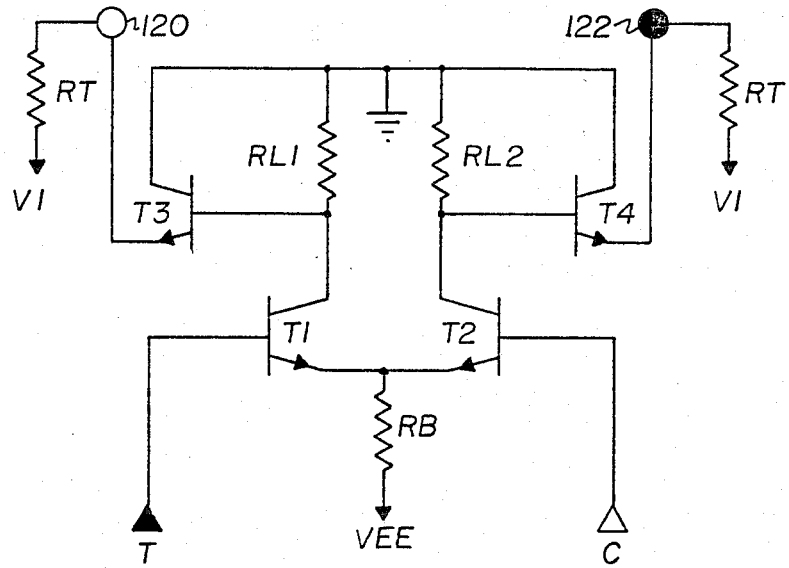
FIG. 7 is a simplified circuit diagram of an ECL Amplifier circuit.

FIG. 7 is a simplified circuit diagram of an ECL Amplifier circuit of the type above-identified. It should be understood that the actual circuit diagram for the identified part includes a complex biasing structure and a plurality of the differential circuits of the type illustrated. As illustrated, Transistors T1 and T2 have their emitters commonly coupled through Bias Resistor RB to VEE which is characteristically minus 4.5 volts. Transistor $T_1$ has its base coupled to the True (T) input terminal and $T_2$ has its base coupled to the Complement (C) input terminal. The convention that will be followed for the operation of the circuit in the differential amplifier mode will be for the closed arrow head to represent the True input signal and the open arrow head to indicate the Complement input signal. The convention at the output will be for the closed circle to represent the True output while the open circle represents the Complement output. This convention will be followed in the circuit diagram. The collector of T1 is coupled to the base of output Transistor T3 and to Load Resistor RL1. In a similar fashion, the collector of T2 is coupled to the base of output Transistor T4 and to Load Resistor RL2. The collectors of output transistors T3 and T4 are coupled to ground, and the emitters are coupled to output terminals 120 for the Complement and 122 for the True, respectively. As previously indicated, the termination of the circuit is accomplished external to the integrated circuit chip, and the Complement output terminal 120 will be coupled through Termination Resistor RT to V1 which is characteristically minus 2 volts DC. Similarly, the True output terminal 122 is coupled through Termination Resistor RT to V1. The circuit operation is such that the voltage differentials applied to input terminals T and C are amplified with respect to the bias voltage resulting in a gain of approximately 8 across the output terminals. This relationship will be described in the context of the invention. FIG. 8 is a circuit diagram representation of the ECL Amplifier.

Returning to a consideration of FIG. 5, and the differential amplifier portion of the circuit, it is seen ECL AMP A3, has its Complement input terminal coupled to junction 124, which is also coupled to line 52 for receiving the DVi signal. The True terminal is coupled to line 54 for receiving $\overline{DVi}$. Its Complementary output terminal 120-1 is coupled to line 126 and to the Complementary input terminal ECL AMP A4. Its True output terminal 122-1 is coupled to line 128 and in turn to the True input terminal of ECL AMP A4. ECL AMP A4 has its Complement output terminal 120-2 coupled to line 130 and the Complement input terminal of ECL AMP A5. The True output terminal 122-2 is coupled to line 132 and the True input terminal of ECL AMP A5. Only a single output of ECL AMP A5 is utilized and has the True output terminal 122-3 coupled to line 58 for providing the feedback signal described above. Terminating Resistors R5 through R10 are each characteristically 50 ohms, and are utilized to couple to the associated output terminal and to provide a termination path for the output transistors to V1. Capacitor C6 is coupled from junction 124 to output terminal 120-1, Capacitor C7 is coupled from line 126 to output terminal 120-2, and Capacitor C8 is coupled from line 130 to output terminal 120-3. Each of these Capacitors are suppression capacitors, characteristically 0.1 microfarad, and are utilized to inhibit oscillation of ECL AMP A3, ECL Amp A4, and ECL Amp A5, respectively.

The circuit component design and selection in the embodiment described is such that the response time of the Oscillator Signal Source 40 is sufficiently faster than the response time of the Low Pass Filters 50 and the differential amplifier circuits 56. As corrections occur, the correction levels do not overshoot, and drive toward correction to the desired 50% duty cycle operation as quickly as possible. The embodiment just described provides the feedback adjustment on line 58 to junction 102 for adjusting the DC level of operation of the Oscillator Signal Source 40, such that the Clock Output 42 is appropriately adjusted with respect to the reference level.

FIG. 9 is a simplified block diagram of an alternative embodiment of a clock source including self-adjustment circuitry for providing adjustment of the Clock Output signal for correcting to a 50 percent duty cycle. In this embodiment, a Signal Source 40-1 can be any signal source capable of providing Source Signals with a 40 to 60 percent duty cycle range of operation. The Source Signals must have finite rise time TR and fall time TF, each of sufficient duration to allow adjustment to occur. These Source Signals are provided on line 42-1 to Coupling Capacitor CC which couples the Source Signals to junction 42-2. The Source Signals are provided to buffer 44-1 which provides the True output signal on line 46-1 and the Complement output on line 48-1 in a manner similar to that described with respect to FIG. 3. Similarly, the True and Complement signals are applied to Low Pass Filters 50-1 which provide the instantaneous Deviation Voltages DVi and $\overline{DVi}$ on lines 52-1 and 54-1 respectively. Op Amp 56-1 provides the feedback signal on line 58-1 to the AC Isolation DC Bias and Duty Cycle Correction circuitry 140. The circuitry 140 functions in response to the feedback signals to adjust the DC bias at junction 42-2, thereby adjusting the Clock Output signal for correcting the duty cycle.

The functioning of the alternative embodiment is similar to that described in FIG. 3 with the exception that the embodiment of FIG. 3 functions to adjust the bias at the Oscillator Signal Source 40 whereas the embodiment of FIG. 9 functions to adjust the bias of the Clock Output signal after having been capacitively coupled to the output terminal. In this regard, the waveform relationships of FIG. 4a through 4k will be similar for both embodiments as to the effect of the self-adjusting circuitry.

Figure 10:
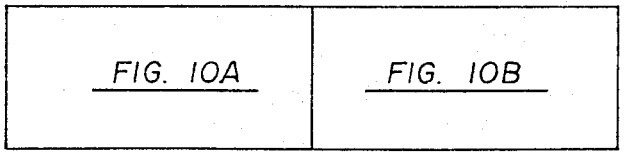
FIGS. 10A and 10B of FIG. 10 are detailed circuit diagrams of the alternative embodiment shown in simplified block diagram form in FIG. 9.

FIG. 10 is a detailed circuit diagram of the alternative embodiment described in FIG. 9. The Signal Source shown enclosed in dashed block 40-1 can be any signal souce capable of providing Clock Output signals at the desired frequency at a 40 to 60 percent duty cycle range, with TR and TF greater than zero. The specific Signal Source shown enclosed in dashed block 40-1 comprises a logic oscillator that has Crystal X1-1 coupled between junctions 80-1 and 82-1 and utilizes ECL Gate A1-1, which can be standard part number 100102. Resistor R11, which can be 200 ohms, is coupled across junctions 142 and 82-1. Capacitor C1-1 is coupled between junctions 142 and 88-1 and is characteristically 0.1 mircofarad. Inductor LDCB establishes the DC bias for the oscillator and is coupled between junctions 142 and 80-1, and is 0.5 microhenry. Phase shifting Capacitor C2-1 is characteristically 30 picofarads and is coupled between the Complement output terminal of ECL Gate A1-1 and ground. For this embodiment Capacitor C2-1 is shown as having adjustment capability. Resistors R0-1 and R0-2 are terminating resistors of 50 ohms and respectively couple junctions 92-1 and 42-1 to junction 100-1 and provides termination for the output circuits of ECL Gate A1-1. Capacitor C9 is coupled between the input terminal line 90-1 and ground and is characteristically 20 picofarads. Capacitor C3-1 is coupled between ground junction 88-1 and feedback junction 102-1, and is characteristically 0.1 microfarad. The output line 42-1 is coupled through Coupling Capacitor CC to output terminal 42-2. Capacitor CC is characteristically 0.001 microfarad. Output terminal 42-2 drives ECL Driver which in turn provides the Clock Output signals.

Inductor L1-1 is shown enclosed in dashed block 140 and is coupled between output junction 42-2 and feedback junction 102-1. Inductor L1-1 is characteristically 0.5 microhenry and functions to establish the DC bias for the output signal. The feedback signal applied from line 58-1 to feedback junction 102-1 functions to adjust the DC bias of the output signals, thereby correcting the duty cycle at output terminal 42-2. In this configuration, then, it can be seen that the feedback for self-adjustment does not function to adjust the bias or operation of the Signal Source 40-1, but rather adjusts the resultant Clock Output bias as described.

The balance of the circuitry illustrated in FIG. 10 including the Buffer shown enclosed in dashed block 44-1, the Low Pass Filters shown enclosed in dashed block 50-1, and the differential amplifier circuit shown enclosed in dashed block 56-1 have the same function and operation and component parts as described above with respect to FIG. 5.

Having described the invention and the preferred embodiments and the drawings, and having pointed out how the objectives and advantages of the invention have been attained, it being understood that various modifications and alterations will be apparent to those skilled in the art without departing from the spirit and scope of the invention what is intended to be protected by Letters Patent is set forth in the appended claims.

What is claimed is:

1. A clock source comprising:
   signal source means for providing source signals at a predetermined frequency;
   buffer means coupled to said signal source means for receiving said source signals and providing true signals and complement signals representative thereof;

low pass filter means coupled to said buffer means for providing voltage levels proportional to the instantaneous deviation of the duty cycle of said source signals from a predetermined duty cycle reference;

differential amplifier means coupled to said low pass filter means for providing duty cycle error signals; and feedback means coupled to said differential amplifier means and said signal source means for adjusting the duty cycle toward said predetermined duty cycle reference.

2. A clock source as in claim 1 wherein said signal source means includes:

crystal means for providing drive signals at a predetermined frequency; and first logic circuit gating means responsively coupled to said crystal means for providing said source signals.

3. A clock source as in claim 2 and further including:

bias means for adjusting the duty cycle of said first logic circuit gating means in response to said duty cycle error signals.

4. A clock source as in claim 3 wherein said signal source means is directly electrically connected to said buffer means, and wherein said feedback means applies said duty cycle error signals to said signal source means for adjusting the bias of said signal source means in response to said duty cycle error signals for adjusting said duty cycle in a predetermined manner.

5. A clock source as in claim 4 wherein said buffer means includes:

second logic circuit gating means responsively coupled to said first logic circuit gating means.

6. A clock source as in claim 5 wherein said low pass filter means comprises:

first and second resistor means, each having a first terminal coupled in series to said buffer means for receiving an associated one of said true signals and said complement signals, and each having a second terminal; and first and second capacitor means, each having a first contact coupled to an associated one of said second terminals and a second contact for receiving a reference voltage, whereby first and second low pass filter networks are formed.

7. A clock source as in claim 6 wherein said differential amplifier means includes:

a plurality of differential amplifier circuits coupled in series for providing said duty cycle errors signals.

8. A clock source as in claim 7 wherein each of said plurality of differential amplifier has an open circuit gain of at least eight and is biased to provide critical damping for preventing over-shoot correction.

9. A clock source as in claim 2 and further including bias and isolation means for adjusting the duty cycle of said source signals in response to said duty cycle error signals; and capacitive coupling means for capacitively coupling said signal source means to said buffer means and to said bias and isolation means.

10. A clock source as in claim 9 wherein said buffer means includes second logic circuit gating means responsive to said source signals received from said first logic circuit gating means, and having a true output terminal and complement output terminal.

11. A clock source as in claim 10 wherein said differential amplifier means includes:

a plurality of differential amplifier circuits coupled in series for providing additive gain of said voltage levels proportional to the instantaneous deviation of duty cycle, in successive ones of said plurality of differential amplifier circuits for providing said duty cycle error signals of sufficient magnitude of drive said bias and isolation means for effecting duty cycle adjustment of said source signals.

12. For use in a clocking system, a clock source comprising:

signal source means for providing source signals at a predetermined frequency, said signal source means including output means for providing clock output signals;

buffer means responsively coupled to said signal source means, and having a true output terminal for providing the true manifestation of said source signals, and a complement output terminal for providing the complement manifestation of said source signals;

low pass filter means responsively coupled to said buffer means for filtering said true and said complement manifestations of said source signals for providing voltage levels from said true and said complement manifestations proportional to the duty cycle of said source signals;

differential amplifier means coupled to said low pass filter means of amplifying the difference in said voltage levels;

bias means coupled to said signal source means for establishing a predetermined level of operation; and feedback means coupled intermediate said differential amplifier means and said bias means for continuously adjusting said bias means for adjusting said predetermined level of operation until said difference in said voltage levels approaches zero, whereby said duty cycle is adjusted toward said predetermined level of operation.

13. A clock source as in claim 12 wherein said signal source means includes:

crystal means for providing drive signals at a predetermined frequency; and first logic circuit gating means responsively coupled to said crystal means for providing said source signals; and wherein said bias means is directly connected to said signal source means and said feedback means, and wherein said first logic circuit gating means is directly connected to said buffer means.

14. A clock source as in claim 12 wherein said signal source means includes:

crystal means for providing drive signals at a predetermined frequency; and first logic circuit gating means responsively coupled to said crystal means for providing said source signals; and further including capacitive coupling means for capacitively coupling said first logic circuit gating means to said buffer means and to said bias means.

15. For use in a clock system, a clocking source comprising:

crystal means for providing drive signals at a predetermined frequency;

first logic circuit gating means responsively coupled to said crystal means for providing clocking signals;

bias means for adjusting duty cycles;

second logic circuit gating means responsively coupled to said first logic circuit gating means, and having a true output terminal for providing the true manifestation of said clock signals, and a complement output terminal for providing the complement manifestation of said clocking signals;

first low pass filter means responsively coupled to said true output terminal for filtering said true manifestation of said clocking signals for providing first voltage levels proportional to the duty cycle of said clocking signals;

second low pass filter means responsively coupled to said complement output terminal for filtering said complement manifestation of said clocking signals for providing second voltage levels proportional to the duty cycle of said clocking signals;

differential amplifier means responsively coupled to said first low pass filter means and said second low pass filter means for amplifying the differences in said first and second voltage levels and for providing duty cycle error signals; and feedback means coupled intermediate said differential amplifier means and said bias means for continuously applying said duty cycle error signals from said differential amplifier means to said bias means for adjusting said bias means until difference in said first and second voltage levels approaches zero, whereby said duty cycles of the clock source is continuously adjusted to approach 50 percent duty cycle.

16. A clock source as in claim 15 wherein said differential amplifier means includes:

a plurality of differential amplifier circuits coupled in series for providing sequential additive amplification of said difference in said first and second voltage levels.

17. A clock source as in claim 16 wherein each of said plurality of differential amplifier means is a logic circuit gating means and includes means to bias operation within a linear range.

18. A clock source as in claim 15 wherein said bias means is directly electrically connected to said first logic circuit gating means, to said second logic circuit gating means, and to said feedback means.

19. A clock source as in claim 15 and further including capacitive coupling means for capacitively coupling said first logic circuit gating means to said bias means and to said second logic circuit gating means.

* * * * *